United States Patent [19]

Nunokawa

[11] Patent Number: 4,771,266
[45] Date of Patent: Sep. 13, 1988

[54] A/D CONVERTER

[75] Inventor: Hideo Nunokawa, Kawasaki, Japan

[73] Assignee: Fujitsu Limited, Kawasaki, Japan

[21] Appl. No.: 915,879

[22] Filed: Oct. 8, 1986

Related U.S. Application Data

[63] Continuation of Ser. No. 640,820, Aug. 15, 1984, abandoned.

[30] Foreign Application Priority Data

Sep. 22, 1983 [JP] Japan ................................ 58-174083

[51] Int. Cl.$^4$ ............................................. H03M 1/46
[52] U.S. Cl. .................................................. 341/161 R
[58] Field of Search .................................. 340/347 AD

[56] References Cited

U.S. PATENT DOCUMENTS

3,503,066 3/1970 Kelly ........................... 340/347 AD

Primary Examiner—Charles D. Miller
Attorney, Agent, or Firm—Staas & Halsey

[57] ABSTRACT

An A/D converter including a D/A converter which generates a reference voltage; a comparator which compares a sampled analog input voltage with the reference voltage; and a sequential comparator control circuit which repeats the comparison steps that input a digital value into the D/A converter in accordance with the result of the determination by the comparator to obtain the result of the conversion. The sequential comparator control circuit inputs an initial digital value to the D/A converter so that a reference voltage larger than one half ($\frac{1}{2}$) of a maximum allowable value of the analog input is supplied to the comparator at the time the A/D conversion commences. The sequential comparator control circuit holds or changes the content of the digital value input to the D/A converter at each comparison step in accordance with the result of the comparison. The comparison step is commenced with any bit except the most significant bit. At this time, when the analog input voltage is determined to be larger than the reference voltage, the most significant bit of the initial digital value is not changed until the A/D conversion is finished, regardless of the result of the determination by the comparator.

5 Claims, 7 Drawing Sheets

A/D CONVERTER

This is a continuation of co-pending application Ser. No. 640,820, now abandoned, filed on Aug. 15, 1984.

BACKGROUND OF THE INVENTION

1. Field of the Invention

The present invention relates to an A/D converter and, more particularly, it relates to a sequential comparison type A/D converter.

2. Description of the Prior Art

A conventional type A/D converter includes a D/A converter which generates a reference voltage; a comparator which compares a sampled analog input voltage with the reference voltage; and a sequential comparator control circuit which repeats the comparison steps that input a digital value into the D/A converter in accordance with the result of the determination by the comparator so as to obtain the result of the conversion. The comparator receives the analog signal input to be converted at its first input, to be compared therewith and receives the analog signal input from the D/A converter at its second input. These signals received at the first input and the second input are compared in the comparator and the compared output is supplied to a sequential comparator control circuit. In a sequential comparator control circuit, the digital output value is varied in accordance with the output of the comparator, so that digital signals are supplied to the D/A converter, which converts the digital signals to an analog signal. The analog signal is supplied to the second input of the comparator, which carries out a second comparison. As a result, comparisons are sequentially carried out at a first time, a second time, and so on, until the first input and the second input are equal to each other, at which point the digital signal corresponding to the analog signal value is obtained.

In the sequential comparison system discussed above, the comparison is started from one half of the maximum reference voltage usually generated in the D/A converter, as disclosed in Japanese Unexamined Patent Publication (Kokai) No. 57-160219. However, when the analog input voltage varies over a wide range including values at which a malfunction can occur in the comparator, as explained in detail hereinafter.

If the comparison is started from a ¾ reference volage, the above-mentioned malfunction is eliminated, as disclosed in Japanese Unexamined Patent Publication No. 58-53222. However, with this later method, when the next value is set in accordance with the comparison result, an error in comparison may routinely occur, as explained in detail hereinafter.

SUMMARY OF THE INVENTION

In view of the above-mentioned problems in the prior art, an object of the present invention is to provide an A/D converter in a ¾ reference voltage sequential type comparison system which can eliminate the causes of malfunctions in the sequential comparator register.

This object can be achieved by an A/D converter comprising a D/A converter which generates a reference voltage; a comparator which compares a sampled analog input voltage with the reference voltage; and a sequential comparator control circuit which repeats the comparison steps that input a digital value into the D/A converter in accordance with the result of the determination by the comparator so as to obtain the result of the conversion. The sequential comparator control circuit inputs an initial digital value into the D/A converter so that the reference voltage larger than one half (½) of a maximum allowable value of the analog input is supplied to the comparator when the the A/D conversion commences. The sequential control circuit is constructed to hold or change the content of the digital value input to the D/A converter at each comparison step in accordance with the result of the comparison. The comparison step is commenced with any bit except the most significant bit. At this time, if the analog input voltage is determined to be larger than the reference voltage, the most significant bit of the initial digital value is not changed until the A/D conversion is finished, regardless of the result of the determination by the comparator.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
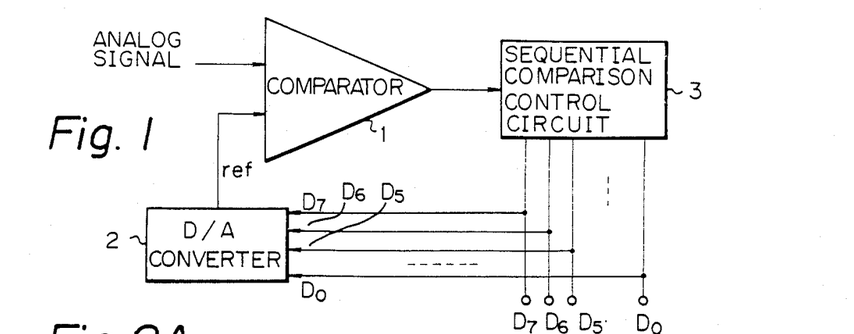
FIG. 1 is a block diagram of one example of the conventional A/D converter in a sequential comparison system.

FIG. 1 shows a block diagram of a sequential comparison type A/D converter. In FIG. 1, a comparator 1 receives an analog signal input at a first input, a second input of the comparator 1 receives an analog signal input from a DA converter 2. The signals received at the first input and the second input are compared in the comparator 1, and the compared output is supplied to a sequential comparator control circuit 3. In the sequential comparator control circuit 3, the digital value is varied in accordance with the output of the comparator 1, so that digital signals $D_0, \ldots, D_5, D_6, D_7$ are supplied to the DA converter, which convert the digital signals $D_0, \ldots, D_7$ to an analog signal. The analog signal is supplied to the second input of the comparator 1, which carries out a second comparison. As a result, the comparisons are sequentially carried out at a first time, a second time, and so on, until the first input of the comparator and the second input are equal in value to each other, at which point the digital signals $D_0, \ldots, D_7$ corresponding to the analog signal value are obtained at the output terminals of the control circuit 3.

Figure 2A:
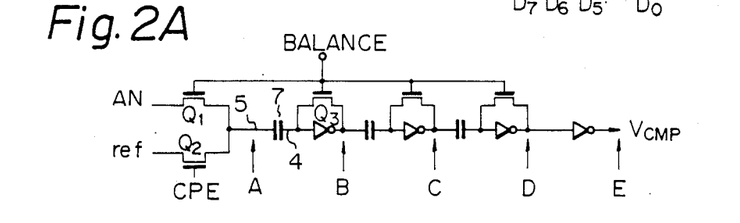
FIG. 2A is a detailed circuit diagram of the sequential comparator of FIG. 1.
Figures 2B, 2C:
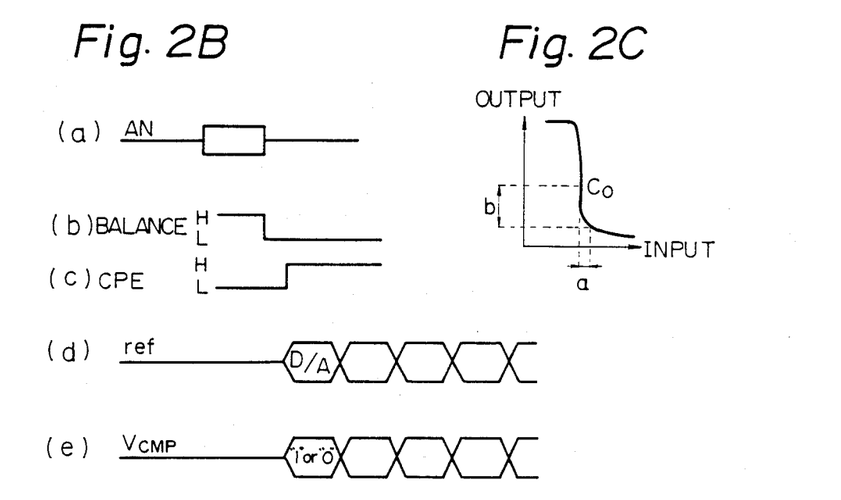
FIGS. 2B and 2C are waveforms and a diagram showing an operation of the sequential comparator of FIG. 2A.

In the circuit shown in FIG. 1, the comparator 1 is constructed as shown in FIG. 2A. FIG. 2B shows a timing chart illustrating (a) a sampled analog signal, (b) a balance signal (BALANCE), (c) a comparator enable signal (CPE), (d) a reference signal, and (e) an output signal $V_{CMP}$. In FIG. 2A, a balance signal BALANCE (FIG. 2B (b)) is at H (high level), the analog input voltage (FIG. 2B (a)) is input via a transistor $Q_1$, the CPE signal (FIG. 2B (c)) then becomes H (high level), i.e., enters the comparison mode, and the D/A output (FIG. 2B (d)) is input via a transistor $Q_2$. At this time, a voltage corresponding to a potential difference "a" (see FIG. 2C) between the analog input and the output of the D/A converter is generated at a node A (FIG. 2A). This potential difference "a" is amplified into "b" (see FIG. 2C) at a node B (FIG. 2A), as shown in FIG. 2C. As a result, the further amplified voltage is obtained at nodes C, D, and E (FIG. 2A). For example, if it is assumed that the analog input voltage is 10 mV, the D/A comparator output is 12 mV, and the amplification factor of each inverter is 10, the voltage change of 2 mV at nodes A and 4 gives output voltage changes of −20 mV, +200 mV, and −2.0 V at nodes B, C, and D (FIG. 2A), and an H (high level) signal is output at node E. Therefore, the reference voltage (ref) (D/A converter output) is higher than the analog input (AN).

In the sequential comparison system shown in FIG. 2A, the comparison is started from ½ of the maximum reference voltage usually generated in by the D/A converter. However, when the analog input voltage varies over a wide range, a malfunction is produced in the comparator, as explained in detail below with reference to FIG. 2A.

When the balance signal BALANCE is at H (high level), that is, in the balance mode, the voltage at a point 4 is usually about 1.2 V, which is equal to the input threshold voltage of the inverter. In this state, if the maximum voltage of the analog signal, for example, 5 V, is supplied, the voltage at point 5 becomes 5 V, thus a potential difference of 3.8 V appears between two terminals of the capacitor 7, and charges 3.8 C (where C is the capacitance of the capacitor 7) are stored in the capacitor 7. Then the balance signal BALANCE goes to L (low level).

The maximum reference voltage REF is assumed to be 5.6 V, thus the ½ maximum reference voltage (ref=½ REF) is 2.8 V. When this 2.8 V is supplied to the comparator 1 as the initial reference output of the D/A converter. When the comparator enable signal CPE becomes H, the voltage at point 5 becomes 2.8 V, which causes the voltage at point 4 to fall to less than −1.0 V due to the capacitive coupling via the capacitor 7. Then a PN junction formed between a diffusion region of the MOS transistor $Q_3$ and a semiconductor substrate is forwardly biased, and therefore, current flows from the semiconductor substrate grounded at earth potential to point 4, and the voltage at point 4 becomes 0 V. Accordingly, the amount of electric charge in the capacitor 7 changes from 3.7 C to 2.8 C, causing a malfunction. Therefore, if the comparison is started from the ¾ maximum reference voltage (ref=¾ REF), the voltage at point 5 is 4.2 V (the maximum reference voltage REF is assumed to be 5.6 V), and the voltage at point 4 is about 0.4 volt, eliminating the above-mentioned drawback.

This is achieved by making an initial value of the sequential comparison register in the sequential comparator control circuit 3 from $(80)_H$ to $(C0)_H$ when the resolution is 8 bits. However, in this method, when the next value is set in accordance with the comparison result, an error in comparison may routinely occur. This state is shown in FIGS. 3A and 3B.

Figure 3A:
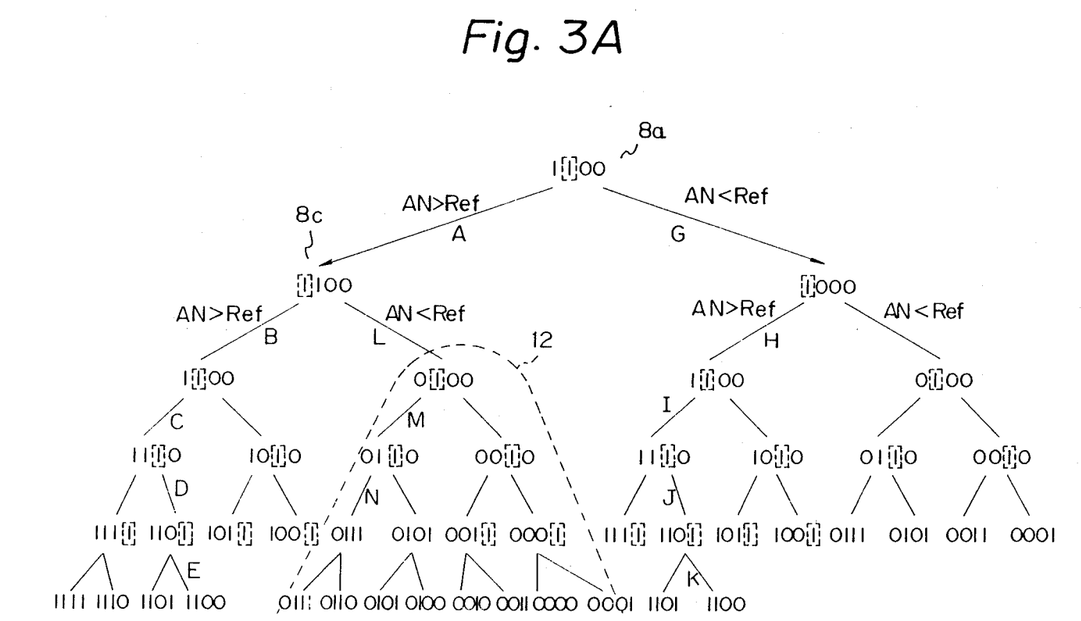
FIG. 3A is a diagram showing an operation of the A/D converter of FIG. 1.
Figure 3B:
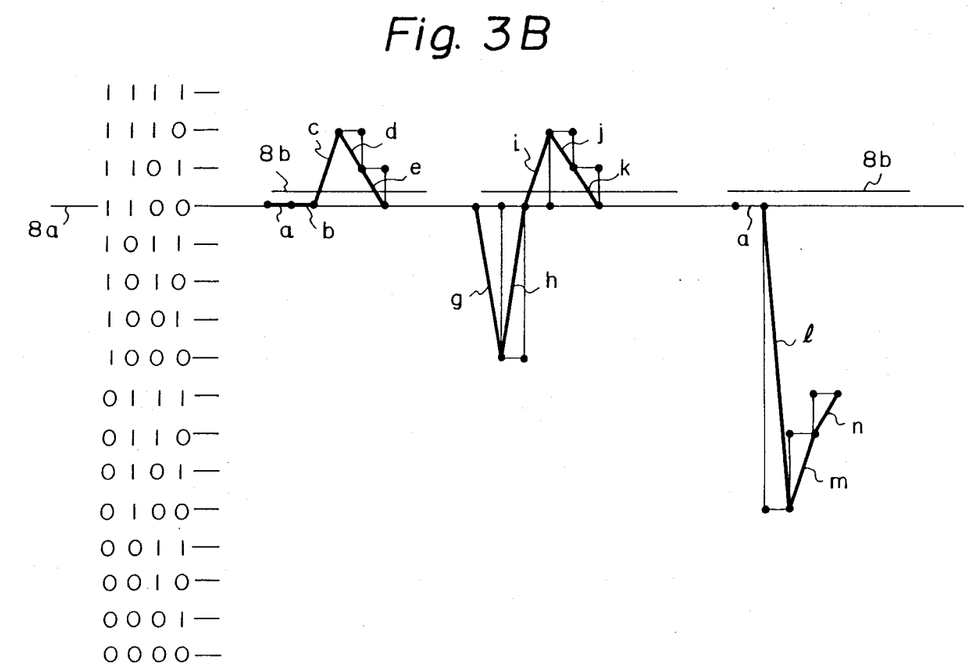
FIG. 3B is a diagram showing the algorithm of the A/D converter of FIG. 1.

Before explaining FIGS. 3A and 3B, an explanation is given of the algorithm of the sequential comparison control circuit. That is, the comparison step is commenced with any bit except the most significant bit, according to the result of the following algorithm:

(a) When the compared signal is larger, i.e., at "H", than the initial value, the compared bit or specific bit is placed to the value "1", and the next bit to be compared is also placed to the value "1".

(b) When the compared signal is smaller than the initial value, the compared bit is placed to the value "0", and the next bit to be compared is also placed to the value "1".

In FIGS. 3A and 3B, Ref denotes the current reference voltage level corresponding to the current digital value, 8a denotes an initial value, and 8b denotes an analog signal to be compared. In FIG. 3B, in the normal state, the analog value 8b is compared with the initial value 8a, in which the comparison process is effected by a path a→b→c→d→e and the compared value is set to the value "1100". This path is shown in FIG. 3A as A→B→C→D→E. In FIG. 3B, when the analog signal 8b is determined as smaller than the initial value 8a at a first comparison, i.e., AN<Ref at the first time, the comparison process is effected by another path g→h→i→j→k and the compared value is set to the value "1100". This path is shown in FIG. 3A as G→H→I→J→K. This different path to the correct result can be caused by noise in the analog input value.

However, in FIG. 3B, when the analog signal 8b is determined as larger than the reference value 8c at a second time, i.e., AN<Ref, the comparison process is effected by another path a→l→m→n and, finally, the value "0111" is output. This error path is shown in FIG. 3A as A→L→M→N. Note: In FIG. 3A, reference numeral 12 illustrates a malfunction mode region.

To attain the object of eliminating the malfunction in the sequential comparator analog, when the reference value is determined as larger than the reference value, no comparison below a second comparison is carried out, so that the path B→C→D is used.

Figure 4:
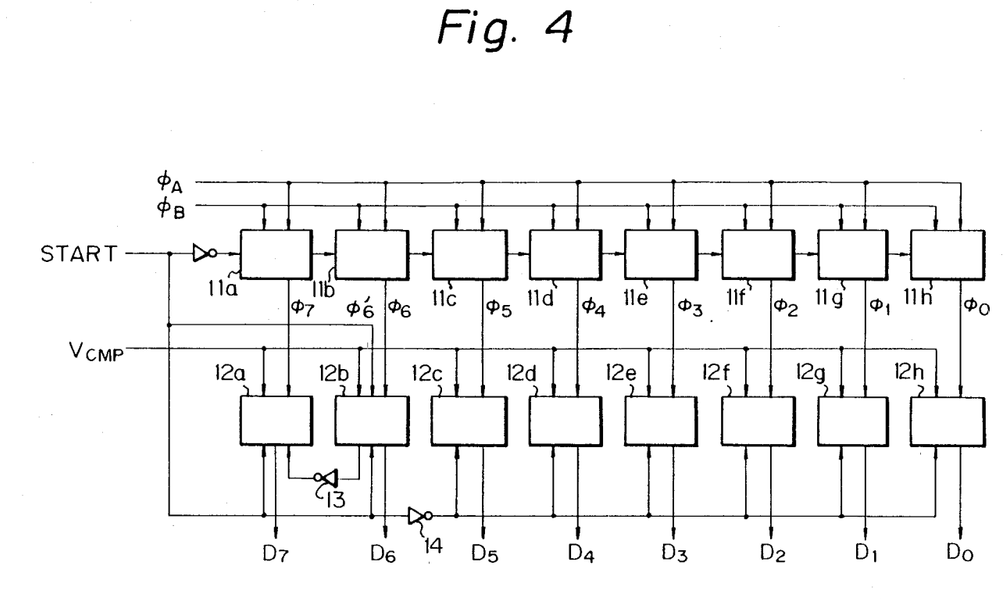
FIG. 4 is a block diagram of one embodiment of the A/D converter according to the present invention.

The circuit diagram for realizing the above object in accordance with the present invention is shown in FIG. 4. In FIG. 4, 11a through 11h denote shift registers, 12a through 12h denote sequential comparator registers, and 13 and 14 denote inverters, respectively. In FIG. 4, the shift registers 11a to 11h are driven by clock pulses $\phi_A$ and $\phi_B$ in such a manner that, when the start pulse is applied to the first shift register 11a and the pulse is shifted, the pulse is shifted sequentially. That is, the start pulse is supplied to the first shift register 11a and the sequential comparison registers 12a to 12h, the inverter 13 feeds back the output of the sequential comparison register 12b to the register 12a, as explained hereinafter, and the inverter 14 inhibits a value lower than three bits, from further transmission. The output terminals $D_7$ to $D_0$ corresponds to those of the sequential comparison control circuit 3 shown in FIG. 1.

Figure 5:
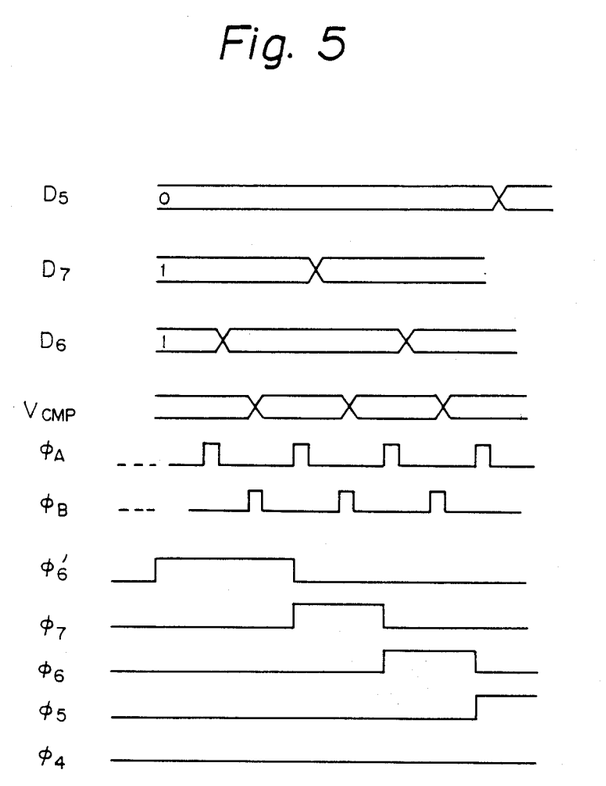
FIG. 5 is a time chart explaining the operation of the A/D converter of FIG. 4.

FIG. 5 is a time chart explaining the operation of the circuit shown in FIG. 4. As shown in the figure, the start pulse $\phi_6'$ is supplied to the first shift register 12a, and the pulses $\phi_7$, $\phi_6$, $\phi_5$, and $\phi_4$ are generated by the control circuit receives the clock pulses $\phi_4$. When the clock pulse $\phi_4$ and the output of the comparator $V_{CMP}$, and outputs 1, 1, 0 are generated at the output terminals $D_7$, $D_6$, and $D_5$ sequentially.

Figure 6:
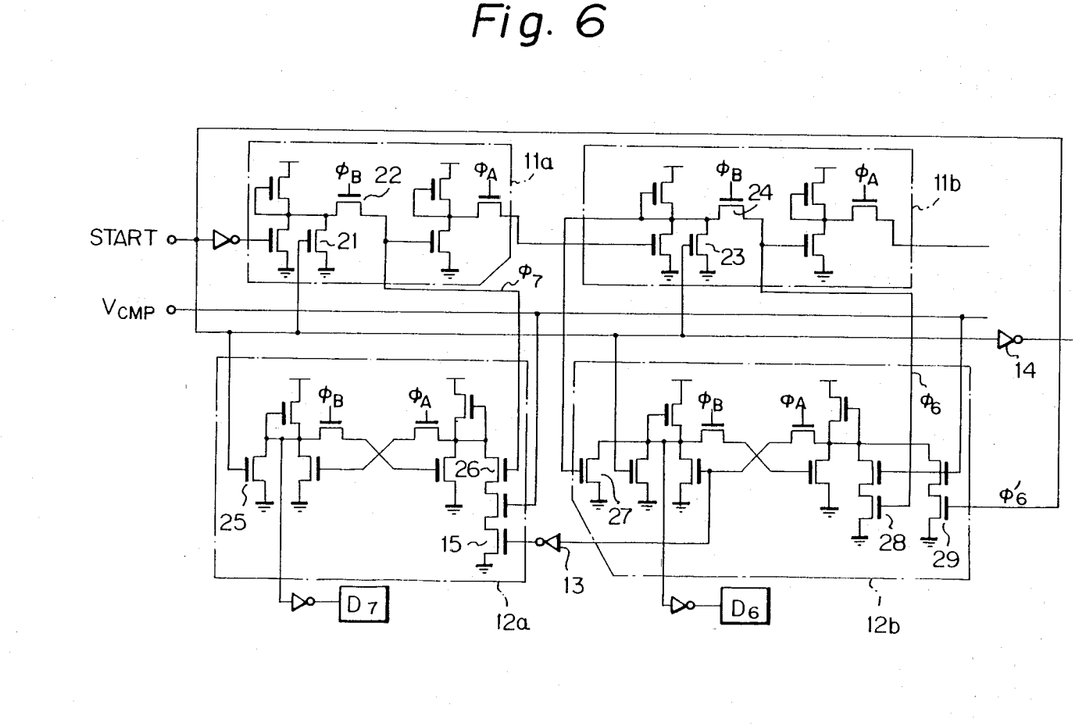
FIG. 6 is a detailed circuit diagram of the sequential comparison registers 12$a$ and 12$b$ of FIG. 4.

FIG. 6 shows a detailed circuit diagram of the sequential comparator registers 12a, 12b, and the shift registers 11a, 11b shown in FIG. 4. In FIGS. 4 and 6, the inverters 13 and 14 are added to the conventional circuit for the purpose of carrying out the present invention. In the circuit shown in FIG. 6, when the start pulse START is supplied, the base of the transistor 21 becomes high, so that the collector of the transistor 21 and the output clock $\phi_7$ become low. Similarly, the output clock $\phi_6$ also becomes low. The base of the transistor 29 becomes high and the bases of the transistors 25 and 27 also become high, so that the collectors of the transistors 25 and 27 become low. Accordingly, the high levels appear at the terminals $D_6$ and $D_7$. In this state, when the output $D_6$ of the comparator register 12b is determined as the high level (H level), the output of the inverter 13 becomes low level, and the transistor 15 is placed in an off state. Therefore, the output $D_7$ of the comparator register 12a is fixed at a high level regardless of the input level thereof.

Figure 7:
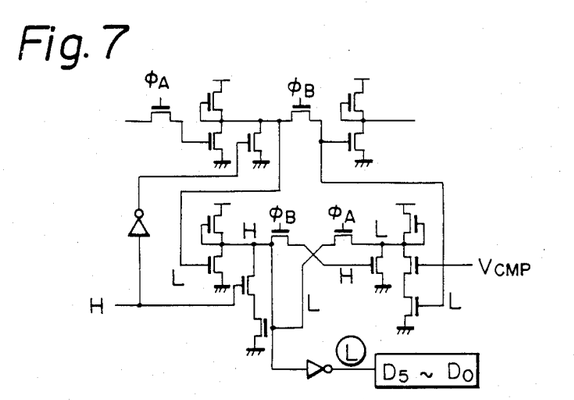
FIG. 7 is a detailed circuit diagram of the sequential comparison registers 12$c$ to 12$h$ of FIG. 4.
Figure 8A:
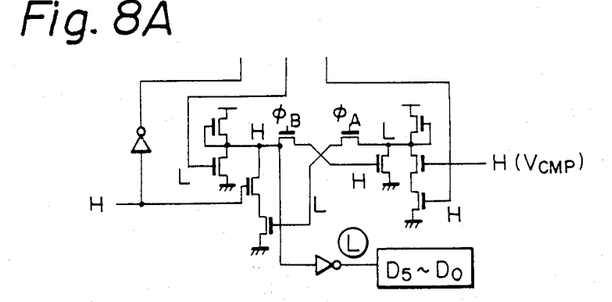
FIGS. 8A and 8B are diagrams of the signal levels during the operation of the circuit of FIG. 7.
Figure 8B:
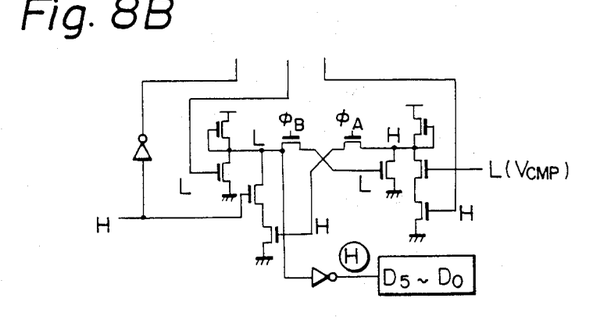

FIG. 7 shows a detailed circuit diagram of the registers 12c through 12h shown in FIG. 4. FIG. 7 shows the state wherein the registers are not in the enable (ENABLE) mode, and the symbols H and L indicate the high level state and the low level state at those points, respectively. FIG. 8(A) shows the levels at each point when the register is in the enable state and ref>AN is the H level. In this case, the bit output levels $D_5$ to $D_0$ become the L level. FIG. 8(B) shows the levels at each point when ref>AN is the L level. In this case, the bit output levels $D_5$ to $D_0$ become the H level.

As explained in detail above, according to the present invention, the malfunction mode of the sequential comparator register in the A/D converter in the $\frac{3}{4}$ reference voltage sequential comparison system can be eliminated, so that a great improvement is effected by the present invention over the conventional system.

The above embodiment of the present invention is used for a $\frac{3}{4}$ reference voltage sequential comparison system. However, it is understood that present invention is applicable also when the reference voltage larger than one half ($\frac{1}{2}$) of a maximum allowable value of the analog input is supplied to the comparator at the time the A/D conversion commences. Accordingly the sequential control circuit is constructed to hold or change the content of the digital value input to the D/A converter at each comparison step in accordance with the result of the comparison, and the comparison step is commenced with any bit except the most significant bit.

I claim:

1. An A/D converter, comprising:
   a comparator for receiving an analog value to be compared,
   a D/A converter, operatively connected to said comparator, for supplying an analog comparison value to said comparator; and
   sequential comparison control means, operatively connected to said comparator and said D/A converter, for supplying a digital value to said D/A converter in dependence upon the analog comparison by said comparator and performing binary search control, for supplying a constant initial digital value to said D/A converter in dependence upon the analog comparison by said comparator and performing binary search control, for supplying an initial digital value to said D/A converter always greater than one-half a range of said A/D converter for analog comparison by said comparator, and for starting an analog comparison with the initial digital value which uses the most significant bit and in which a bit change search sequence always starts with any bit in the digital value except the most significant bit.

2. An A/D converter receiving a start signal and comprising:
   a comparator for receiving an analog value to be compared;
   a D/A converter, operatively connected to said comparator, for supplying an analog comparison value to said comparator; and
   sequential comparison control means, operatively connected to said comparator and said D/A converter, for supplying a digital value to said D/A converter in dependence upon the analog comparison by said comparator and performing binary search control, for supplying an initial digital value to said D/A converter greater than one-half a range of said A/D converter for analog comparison by said comparator, and for starting an analog comparison with the initial digital value which uses the most significant bit and in which a bit change search sequence starts with any bit in the digital value except the most significant bit, said sequential comparison control means comprising:
   N shift registers connected in series and to receive the start signal, where N is the number of bits in the digital value;
   N sequential comparison registers, each connected to said comparator and the corresponding shift register, and first and second sequential comparison registers connected to receive the start signal;
   a first inverter connected between the first and second sequential comparison registers to fix an output of the first sequential comparison register at a predetermined value; and
   a second inverter connected to receive the start signal and to the third through Nth sequential comparison registers.

3. An A/D converter, comprising:
   a D/A converter for generating a reference voltage;
   a comparator, operatively connected to said D/A converter, for comparing a sampled analog input voltage with said reference voltage; and
   sequential comparison control circuit means, operatively connected to said comparator and said D/A converter, for repeating binary search comparison steps that input a digital value into said D/A converter in accordance with the result of the determination by said comparator so as to obtain the result of the conversion, for always inputting a constant initial digital value to said D/A converter to supply a reference voltage larger than one half ($\frac{1}{2}$) of a maximum allowable value of said analog input to the A/D converter at the time the A/D conversion commences, for holding or changing the content of a specific bit of the digital value which is input to said D/A converter at each comparison step in accordance with the result of the comparison, the specific bit corresponding to the comparison step, for always commencing an initial analog comparison step with the initial digital value which includes use of the most significant bit and in which the specific bit is any bit except the most significant bit, and when said analog input voltage is larger than said reference voltage at the initial comparison step, for changing the most significant bit of said initial digital value after the A/D conversion is finished, regardless of the result of the determination by said comparator.

4. An A/D converter according to claim 1, wherein the reference voltage is at least ¾ of a maximum allowable value of said analog input and is used as the reference voltage larger than one half of a maximum allowable value of said analog input.

5. An A/D converter, comprising:

a D/A converter for generating a reference voltage;

a comparator, operatively connected to said D/A converter, for comparing a sampled analog input voltage with said reference voltage; and sequential comparison control circuit means, operatively connected to said comparator and said D/A converter, for repeating binary search comparison steps that input a digital value into said D/A converter in accordance with the result of the determination by said comparator so as to obtain the result of the conversion, for inputting an initial digital value to said D/A converter to supply a reference voltage larger than one half (½) of a maximum allowable value of said analog input to the A/D converter at the time the A/D conversion commences, for holding or changing the content of a specific bit of the digital value which is input to said D/A converter at each comparison step in accordance with the result of the comparison, the specific bit corresponding to the comparison step, for commencing an initial analog comparison step with the initial digital value which includes use of the most significant bit and in which the specific bit is any bit except the most significant bit, and when said analog input voltage is larger than said reference voltage at the initial comparison step, for changing the most significant bit of said initial digital value after the A/D conversion is finished, regardless of the result of the determination by said comparator, said sequential comparison control circuit means comprising:

a plurality of shift registers sequentially connected to receive and driven by first and second clock pulses, and when a first shift register receives a start pulse, each of said shift registers outputs pulses which are shifted sequentially;

a plurality of sequential comparator registers, operatively connected to corresponding shift registers and to said comparator, each of which are driven by the corresponding output of said shift register, and by said start pulse, and the output of said comparator is supplied to each of said sequential comparator registers and including first through third sequential comparator registers;

a first inverter circuit connected between the second sequential comparator register and the first sequential comparator register; and a second inverter circuit connected to receive said start pulse and to said third sequential comparator register.

* * * * *

UNITED STATES PATENT AND TRADEMARK OFFICE
CERTIFICATE OF CORRECTION

PATENT NO.  : 4,771,266

DATED       : September 13, 1988

INVENTOR(S) : Nunokawa

It is certified that error appears in the above-identified patent and that said Letters Patent is hereby corrected as shown below:

Col. 1, line 28, "the" should be --a--.

Col. 2, line 3, "the" should be --a--;

line 5, delete third occurrence of "the";

line 54, "DA" should be --D/A--;

line 61, "DA" should be --D/A--.

Col. 3, line 31, delete "in".

Col. 4, line 3, "$(80)_H$ to $(C0)_H$" should be --$(8\phi)_H$ to $(C\phi)_H$--;

line 38, "larger" should be --smaller--;

line 45, "reference" should be --analog--;

Col. 5, line 2, delete "control circuit receives the" and after "When the" insert --control circuit receives the--.

Signed and Sealed this

Twenty-fifth Day of April, 1989

Attest:

DONALD J. QUIGG

Attesting Officer     Commissioner of Patents and Trademarks